US006899145B2

(12) United States Patent
Aggarwal

(10) Patent No.: US 6,899,145 B2
(45) Date of Patent: May 31, 2005

(54) FRONT OPENING UNIFIED POD

(75) Inventor: Ravinder Aggarwal, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 10/393,717

(22) Filed: Mar. 20, 2003

(65) Prior Publication Data

US 2004/0182472 A1 Sep. 23, 2004

(51) Int. Cl.$^7$ ................................................ B65B 1/20
(52) U.S. Cl. .......................... 141/11; 141/8; 141/65; 141/69; 141/85; 141/89; 141/91
(58) Field of Search ............................. 141/1, 4, 8, 11, 141/37, 44, 47, 48, 52, 63, 65, 69, 85, 89, 91, 92, 286; 118/710–715; 206/710, 711

(56) References Cited

U.S. PATENT DOCUMENTS 4,745,088 A * 5/1988 Inoue et al. ................... 117/98
5,879,458 A * 3/1999 Roberson et al. ............ 118/715
5,988,233 A    11/1999 Fosnight et al.
6,364,922 B1    4/2002 Tanaka et al.

OTHER PUBLICATIONS

"Provisional Specification for 300–mm Front–Opening Interface Mechanical Standard (FIMS)", SEMI E62–0997 (1997).

* cited by examiner

Primary Examiner—Timothy L. Maust
(74) Attorney, Agent, or Firm—Knobbe, Martens, Olson & Bear LLP

(57) ABSTRACT

A front opening unified pod (FOUP) used for temporarily and portably storing semiconductor wafers between processing steps includes a manifold for uniformly distributing a purge gas in the FOUP during a purging process between wafer processing steps. The manifold can be a variety of shapes, and can be located in a number of appropriate locations within the FOUP. The manifold generally extends the full height of the FOUP and includes a plurality of openings configured to direct a flow of purge gas above and below each wafer held by the FOUP.

29 Claims, 5 Drawing Sheets

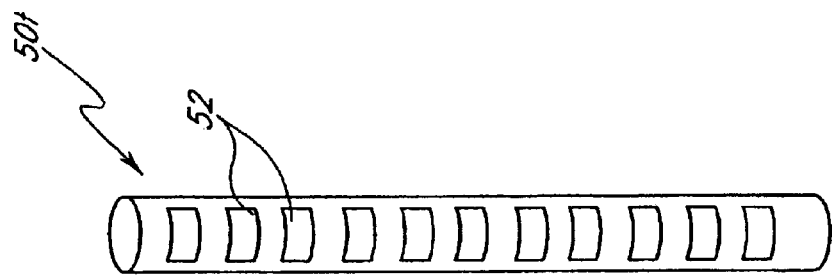
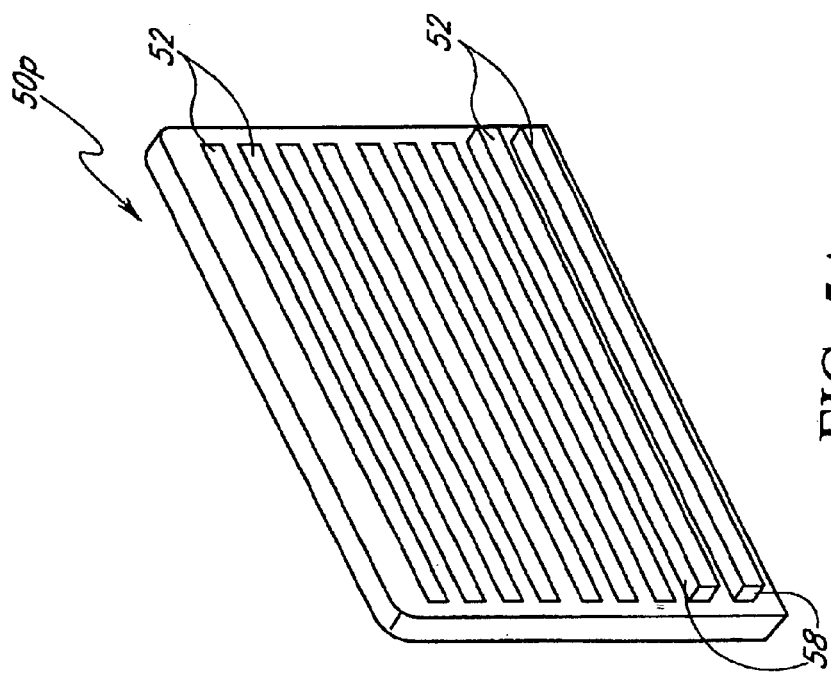

FRONT OPENING UNIFIED POD

BACKGROUND

1. Field of the Invention

The invention relates in general to the field of semiconductor processing apparatus, and specifically to an improved Front Opening Unified Pod (FOUP).

2. Description of the Related Art

In the semiconductor manufacturing industry, a FOUP (Front Opening Unified Pod) is a container used to portably store a plurality of semiconductor wafers between processing steps. FOUPs are typically configured to be placed at an interface of a processing tool and are generally provided with a door configured to be automatically removed. Depending on a number of factors such as the size of a production run, cycle time, etc, wafers may sit in a FOUP for a substantial length of time between processing steps. During this time, it is possible for oxygen and moisture to leak into the FOUP. Unfortunately, moisture and oxygen have detrimental effects on the surfaces of semi-conductor wafers, and thus it is desirable to minimize the exposure of the wafers to these elements.

Moisture and oxygen levels can be reduced within an enclosed FOUP by introducing a purge gas (typically $N_2$). Such FOUPs may have inlet and outlet ports in their bottom surface, as seen for example in U.S. Pat. No. 5,988,233 to Fosnight et al, particularly the disclosure regarding inlet and outlet ports is incorporated herein by reference and made part of the present disclosure. While purging delays or reduces oxidation and particle formation in the FOUP, there is a remaining need for a process for more quickly and efficiently reducing moisture and oxygen content within a FOUP to acceptable levels.

SUMMARY

In accordance with one aspect of the invention, a semiconductor apparatus comprises an enclosed container having a plurality of walls and an entry with a removable door for providing access to the container. The container is configured to receive a plurality of semiconductor wafers to be protected from an environment outside the container. The entry is configured to mate with other wafer processing equipment to enable wafers to be transferred to and from the container directly into the processing equipment. The container has a port configured to be connected to a source of a purge gas, and a manifold in fluid communication with the port. The manifold comprises a plurality of openings configured to direct a purge gas across the wafers.

According to another aspect of the invention, a system is provided for controlling an atmosphere in a semiconductor substrate carrier. The system includes an enclosable container configured to receive and support a plurality of wafers. First and second ports are provided in a wall of the container. A source of purge gas is provided in fluid communication with the first port and is configured to inject the purge gas into the container. A vacuum pump is provided in fluid communication with the second port and is configured to remove gases from the container. A first manifold configured to direct a flow of gas between adjacent wafers is provided in fluid communication with the first port. A second manifold is in fluid communication with the second port, where the second manifold is configured to take in a gas.

In accordance with still another aspect of the invention, a manifold is provided which comprises a plurality of vertically spaced openings. According to this embodiment, the spacing between the openings corresponds to a spacing between adjacent stacked semiconductor wafers. The manifold is preferably made of a substantially non-reactive plastic material.

In accordance with yet another aspect of the invention, a method is provided for reducing moisture and oxygen content of a semiconductor wafer container. The method includes providing a container with ports and manifolds as described above, and initiating a flow of purge gas into the container.

For purposes of summarizing the invention and the advantages achieved over the prior art, certain objects and advantages of the invention have been described herein above. Of course, it is to be understood that not necessarily all such objects or advantages will be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The disclosed embodiment(s) are intended to be within the scope of the present invention herein disclosed and will become readily apparent to those skilled in the art from the following detailed description of the preferred embodiment(s) having reference to the attached figures. The invention should not be limited to any particular preferred embodiment(s) disclosed.

BRIEF DESCRIPTION OF DRAWINGS

Having thus summarized the general nature of the invention, certain preferred embodiments and modifications thereof will become apparent to those skilled in the art from the detailed description herein having reference to the figures that follow, which:

FIG. 5a is a perspective view of a substantially planar purge gas manifold for use in the FOUP of FIG. 4 constructed in accordance with one embodiment of the invention;

FIG. 6 is a perspective view of a substantially tubular purge gas manifold for use in the FOUP of FIG. 4 constructed in accordance with another embodiment of the invention.

DETAILED DESCRIPTION

The embodiments taught herein can be used to maintain oxygen and water vapor concentrations in a FOUP within acceptable levels by more efficiently purging a FOUP. The purging efficiency is generally improved by providing a manifold configured to direct a flow of gases uniformly across the wafers supported in a FOUP. The purging process may be driven by a gas inlet, an outlet vacuum pump, or any appropriate combination of the two. As will be clear to those skilled in the art in view of the disclosure herein, no single element or feature discussed herein should be considered essential or necessary to the successful practice of the invention.

Figure 1:
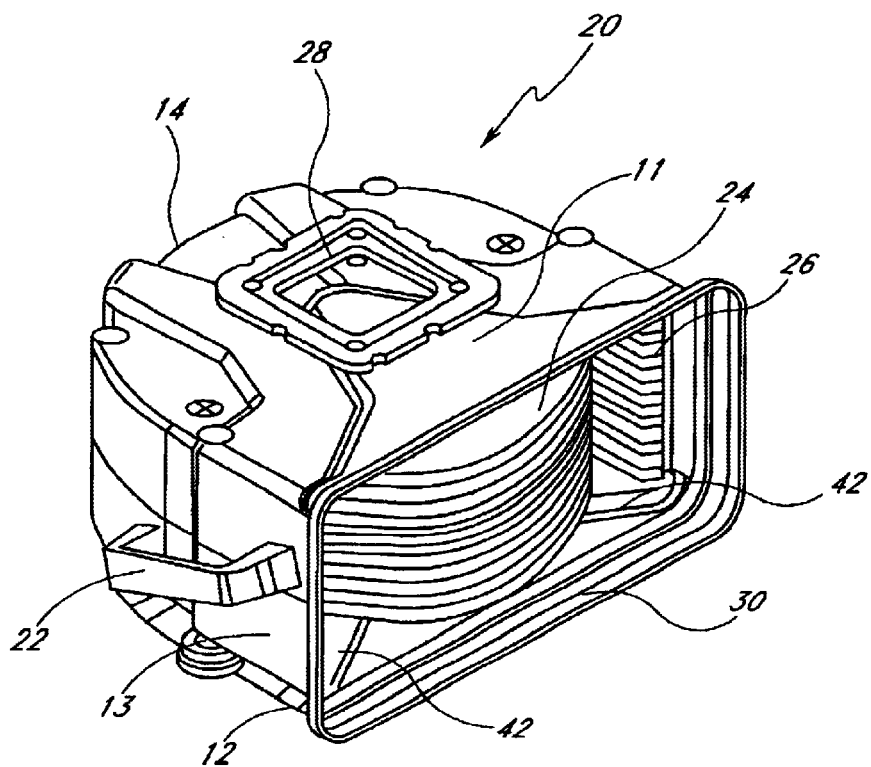
FIG. 1 is a top, front and left side perspective view of a Prior Art front-opening unified pod (FOUP) for storing and transporting wafers.
Figure 2:
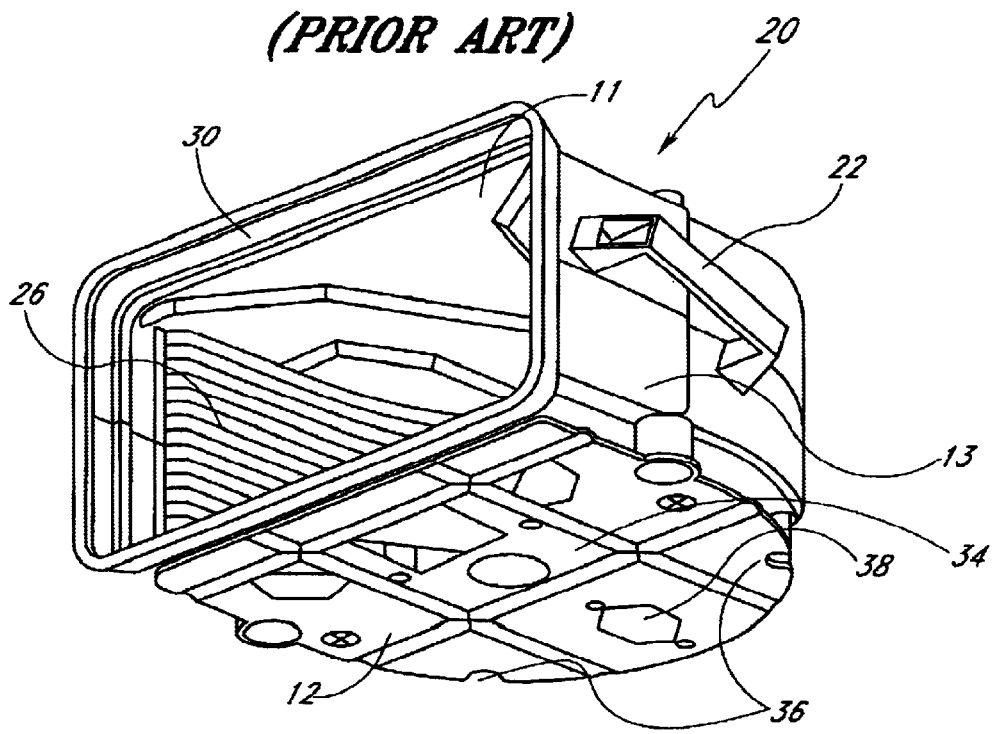
FIG. 2 is a bottom, front and right side perspective view of the prior art FOUP of FIG. 1.

During transport and storage in a semiconductor fabrication facility, wafers are contained inside a container, which may be a front-opening unified pod (FOUP) carrier 20 shown in FIGS. 1 and 2 with the door removed. The FOUP 20 includes top 11, bottom 12, side 13, and rear 14 walls, and slots 26 defined by spaced shelves for holding wafers 24, similar to a standard open wafer cassette, as well as a door 10 (see FIG. 3) for "sealing" the FOUP during transport. The FOUP has a standard mechanical interface for attaching to process tools. The FOUP is designed to isolate the wafers from ambient particulate and molecular contamination, while also providing accurate wafer positioning. The Semiconductor Equipment Materials International Standards Program's document SEMI E47.1 describes specifications for boxes and pods used to transport and store 300-mm wafers and is incorporated herein by reference.

With reference to FIGS. 1 and 2, the box shell of the FOUP 20 is fitted with handles 22 for transporting the FOUP 20 manually. Inside, the wafers 24 are held spaced apart in a stack and supported by slots 26. The top 11 of the FOUP has a handling flange 28 that can be engaged by a robot (not shown) to move the FOUP 20. There is a sealing mechanism 30 at the front opening of the FOUP that is designed to press against and "seal" to a surface of a loading port at a process tool. The skilled artisan will appreciate, however that standardized FOUPs are not truly hermetically sealed, such that small amounts of oxygen, moisture or particles can leak into the FOUP over extended periods of time. On the bottom 12 of the FOUP, there is a coupling plate 34 that contains recess pockets 36 to facilitate in transport and self-locating placement of the FOUP on mating features of a load port.

Figure 3:
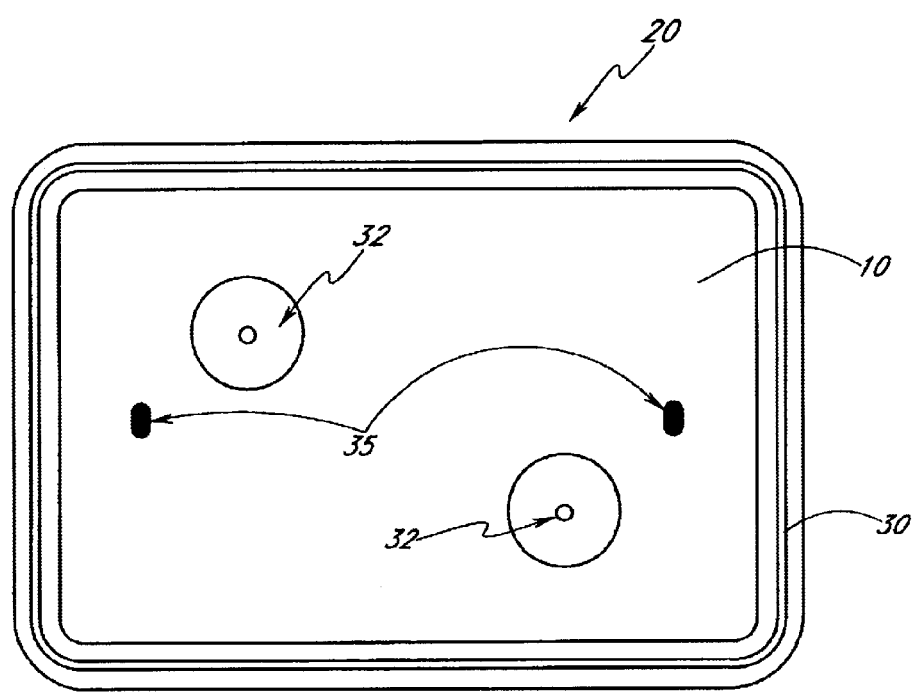
FIG. 3 is a front view of the prior art FOUP of FIG. 1 shown with a door attached.

The FOUP 20 also comprises a removable door 10 as illustrated in FIG. 3. The door generally includes a pair of key slots 35 configured to be engaged to lock and unlock the door from the FOUP 20.

Figure 4:
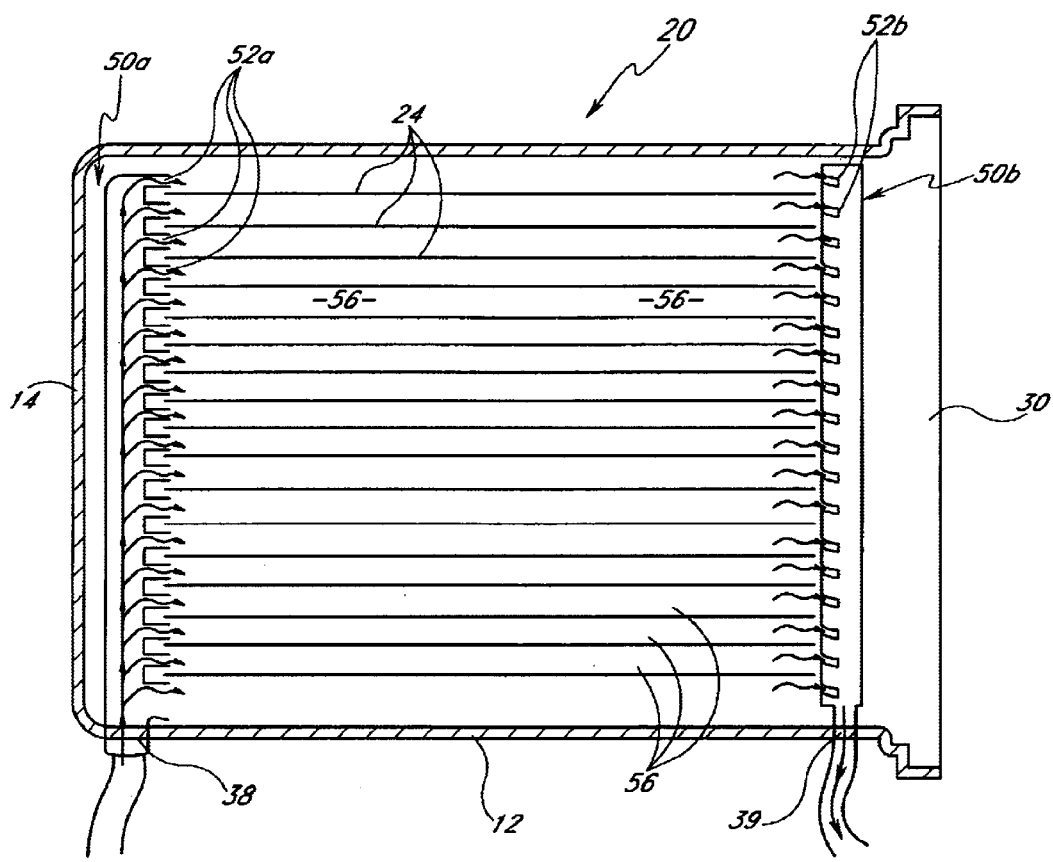
FIG. 4 is a cross-sectional elevation of a FOUP with inlet and outlet purge gas manifolds constructed in accordance with preferred embodiments of the present invention.

With reference to FIG. 4, according to one embodiment, a FOUP, similar in many respects to that of FIGS. 1–3, is additionally provided with a port 38 in a FOUP wall, preferably in the bottom wall 12 such that the FOUP 20 can be joined in fluid communication with a source of purge gas. Inert gases such as Ar, He, etc may be used as purge gases. Alternatively, FOUPs can be purged with reducing gases such as $N_2$ in order to help slow or reverse natural oxidation processes. The port 38 may comprise a check valve configured to limit a flow of purge gas to a single direction, for example gases may flow into, but not out of the FOUP 20. Many check valve designs are known to those skilled in the art, many of which may be used with a FOUP of the present embodiment.

A second port 39 is also provided to be used as an outlet or gas-removal port 39, preferably also on the bottom wall 12. The outlet port 39 can also be provided with a check valve as desired. If desired, the outlet port 39 can be joined in fluid communication with a vacuum pump in order to aid in the replacement of an oxygen and moisture rich atmosphere with an inert purge gas. A vacuum pump can be used to maintain a pressure within a container within a desired range. Typically, the pressure within the FOUP is maintained within a few PSI above atmospheric pressure. For example, the pressure may be maintained between about 14 PSI and about 17 PSI, preferably between about 14 PSI and about 16 PSI, and often between about 14.5 PSI and about 15.5 PSI. In one particular embodiment, the pressure within the FOUP is maintained at about 15.2 PSI.

The FOUP 20 is also preferably provided with features configured to cause the inlet 38 and/or outlet 39 ports to be aligned with a port in a staging surface, shelf, or cart between processing steps. Such features include the recess pockets 36 (FIG. 2) described above. Alternatively, any number of structures such as pins, pockets, slots, etc can be provided in order to conveniently align the FOUP ports 38, 39 with a purge gas supply line and a vacuum pump line (if desired).

In other arrangements, any number of ports in any suitable location can be used as desired. For example, a FOUP can be provided with an inlet port at the rear of the bottom wall and an outlet port at the front of the bottom wall. Alternatively, a FOUP may be provided with an inlet port at a rear of the bottom wall, and two outlet ports at a front of the bottom wall. In still another alternative, a FOUP may be provided with one or more inlet ports in a rear wall, and one or more outlet ports in a front wall or door. Of course, the inlet and outlet ports may alternatively be reversed or located in rear 14, side 13 or top 11 walls or in the door 15 (shown in FIG. 3) as desired. Corresponding mating ports are provided in any surface of a staging area depending on the port locations on the FOUP, such that they can be easily connected with a port in the FOUP. Alternatively still, a vacuum pump or purge gas supply can be provided with a flexible hose with a distal end configured to be joined in fluid communication with a port of the FOUP, thereby allowing manual connection of the supply and outlet lines to the FOUP.

Returning to FIG. 4 the preferred embodiment of the FOUP 20 is provided with an inlet purge gas manifold 50a and an outlet manifold 50b. Preferably, at least the inlet purge gas manifold 50a extends vertically above the FOUP bottom by at least an inch, and often more than half the height of the FOUP 20. The manifold 50a typically includes a plurality of inlet openings 52a configured to distribute flow along the height of the manifold. In the illustrated embodiment, both of the manifolds 50a and 50b extend substantially the full height of the FOUP 20, and include a plurality of inlet openings 52a and outlet openings 52b spaced such that they will direct a flow of purge gas above and below each wafer supported in the FOUP 20. As shown in FIG. 4, each opening pair 52a/52b is preferably aligned with a space 56 between vertically adjacent wafers 24. Alternatively, of course, the openings 52a, 52b can be spaced to span one or more wafer positions, thereby requiring fewer openings 52 for a given manifold. In general, the outlet openings 52b are provided in appropriate number and position such that a purge gas will be distributed across the height of the FOUP, and preferably the purge gas will be uniformly directed between each pair of wafers as well as above the top wafer and below the bottom wafer in a FOUP.

Dimensions of a given manifold will depend on various aspects of the FOUP in which the manifold is to be used as well as a variety of other factors. For example, the number, size and spacing of the openings may be dependent on the number of wafers in the container, the spacing between adjacent wafers, the desired purge time, or any of a number of other factors. For a standard 300-mm wafer FOUP, supporting 25 wafers, In general, the openings are between about 2 mm and about 8 mm, and spaced at between about 5 mm and about 15 mm (on center), more preferably the openings are between about 4 mm and about 6 mm in width or diameter, and spaced at between about 8 mm and about 10 mm (on center), and most preferably the openings are about 5 mm in width or diameter, and spaced at about 9 mm (on center).

The manifolds can be configured to be installed in a number of locations and can be made in a number of shapes. For example, a manifold may be integrally formed with a rear 14 or side 13 wall of the FOUP 20. Alternatively, a manifold may be a removable or permanently attachable retrofit to a standard FOUP.

Figure 5B:
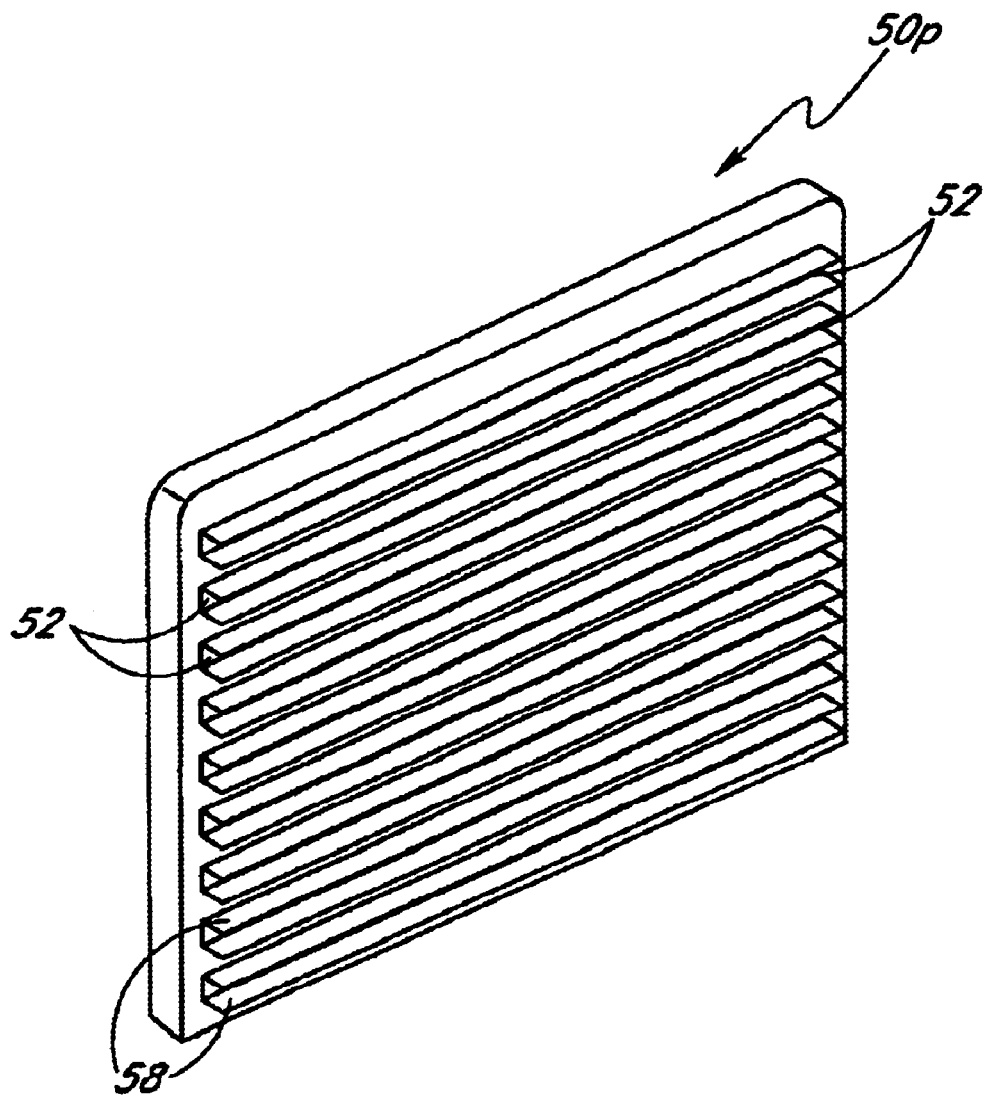
FIG. 5b is a perspective view of a substantially planar purge gas manifold for use in the FOUP of FIG. 4 constructed in accordance with an alternative embodiment of the invention.

A manifold 50p for either gas inlet or outlet can be substantially planar as shown in FIGS. 5a and 5b. A planar manifold 50p can include a plurality of openings 52 spaced as described elsewhere herein. The manifold 50p can comprise one or more vanes 58 between openings 52, as shown in FIG. 5b, to direct a flow of purge gas in a desired direction. The vanes 58 can also be sized and oriented to support wafers within the FOUP. The planar manifold 50p can be made from any suitable material such as a molded plastic. Alternatively, the manifold could comprise a curved surface configured to conform to a shape of a curved FOUP rear wall.

Alternatively, a manifold 50t can be substantially tubular, as shown in FIG. 6. A tube-shaped manifold 50t can be configured to occupy a corner, such as a front corner 42 (FIG. 1) in a commercially available FOUP 20, thereby allowing the manifold 50t to be retrofit into an existing FOUP having a small amount of empty space. The tube manifold 50t can be made from any appropriate material of any suitable hollow prismatic shape. For example, the tube manifolds 50t can be made from circular, rectangular, triangular, or otherwise shaped tubular material. The tube manifold can also be provided with or without guide vanes.

In some situations, it may be desirable to provide a manifold at an outlet port 39 (as shown in FIG. 4) such that the gases within a FOUP can be more efficiently drawn out of the FOUP. Alternatively, the only one or more inlet manifolds are provided to distribute gas, while the outlet manifold can be omitted, and the gases are removed from the FOUP via ports in the door or a bottom, rear, side, or top wall. Many arrangements of inlet and outlet manifolds will become apparent in view of the present disclosure.

For example, in one embodiment, a FOUP can be provided with a single planar manifold 50p at a rear wall 14, and a tubular manifold 50t at one or both front corners 42 of the FOUP 20. Alternatively, a FOUP can be provided with one or more tubular manifolds at the rear of the FOUP and one or more tubular manifolds at the front of the FOUP. Of course, the manifolds and their corresponding ports can be configured to direct a flow of air from front-to-rear or from rear-to-front as desired. Alternatively, planar manifolds can be incorporated into one or both side walls 13.

The FOUP 20 is configured to have largely standard external surfaces to interface with loading ports and FOUP or cassette carts, such as a personally guided vehicle (PGV) or an automatically guided vehicle (AGV). The PGV or AGV can be provided with a port configured to be joined with the FOUP port 38. A PGV or AGV may be provided with a portable purge gas supply and vacuum pump or can be configured to manually or automatically connect to a stationary vacuum pump and/or purge gas supply for maintaining a desired atmosphere within a FOUP carried by the vehicle. A system for keeping a FOUP mounted on a cart during wafer loading/unloading is disclosed in U.S. patent application Ser. No. 09/905578 entitled, "Docking Cart with Integrated Load Port," the disclosure of which is incorporated herein by reference and made part of the present disclosure.

Many materials are known to be suitable for building FOUPs. For example, a FOUP can be made of a substantially strong, rigid plastic.

Although certain preferred embodiments and examples have been described herein, it will be understood by those skilled in the art that the present inventive subject matter extends beyond the specifically disclosed embodiments to other alternative embodiments and/or uses of the invention and obvious modifications and equivalents thereof. Thus, it is intended that the scope of the present inventive subject matter herein disclosed should not be limited by the particular disclosed embodiments described above, but should be determined only by a fair reading of the claims that follow.

I claim:

1. A semiconductor processing apparatus comprising:
    an enclosed container having a plurality of walls and an entry with a removable door for providing access to the container, said container being configured to receive a plurality of semiconductor wafers to be protected from an environment outside the container, said entry being configured to mate with other wafer processing equipment to enable wafers to be transferred to and from the container directly into die processing equipment, said container having an inlet port configured to be connected to a source of a purge gas; and
    a manifold in fluid communication with the port, the manifold comprising a plurality of openings configured to distribute purge gas across the wafers, wherein the manifold is substantially flat and each of the openings is configured to extend substantially across the entire width of a plurality of wafers.

2. The apparatus of claim 1, wherein each opening comprises a vane above or below the opening.

3. The apparatus of claim 2, wherein the manifold is positioned proximate to a rear wall of the container.

4. The apparatus of claim 3, wherein the manifold is integrally formed with a wall of the container.

5. The apparatus of claim 1, further comprising a second manifold in fluid communication with an outlet port, and having a plurality of openings spaced to distribute purge gas between adjacent wafer.

6. The apparatus of claim 5, wherein the second manifold is in fluid communication with a vacuum pump.

7. The apparatus of claim 1, wherein the manifold is integrally formed with a side wall of the container.

8. The apparatus of claim 1, wherein the manifold is located at a front of the container.

9. The apparatus of claim 1, wherein the manifold is located at a side of the container.

10. The apparatus of claim 2, wherein each of the vanes is configured to support semiconductor wafer thereon.

11. The apparatus of claim 1, wherein the purge gas is an inert gas.

12. The apparatus of claim 1, wherein the purge gas is a reducing gas.

13. A system for controlling an atmosphere in a semiconductor substrate carrier, the system comprising:
    an enclosable container configured to receive and support a plurality of wafers,
    first and second ports in a wall of said container;
    a source of purge gas in fluid communication with the first port and configured to inject the purge gas into the container;

a vacuum pump in fluid communication with the second port and configured to remove gases from the container;

a first manifold inside the container and in fluid communication with the first port, the first manifold having a plurality of first manifold openings being configured to deliver purge gas, one of the first manifold openings being positioned between each pair of adjacent wafers, so as to direct purge gas between each pair of adjacent wafers, one of the first manifold openings being positioned above a top-most wafer position of the enclosable container and one of the first manifold openings being positioned below a bottom-most wafer position of the enclosable container; and a second manifold inside the container and in fluid communication with the second port, the second manifold having a plurality of second manifold openings being configured to take in a gas, one of the second manifold openings positioned between each pair of adjacent wafers so as to take in purge gas between each pair of adjacent wafers, one of the second manifold openings being positioned above the top-most wafer position and one of the first manifold openings being positioned below the bottom-most wafer position.

14. The apparatus of claim 13, wherein the second manifold is located at a front of the container.

15. The apparatus of claim 13, wherein the first manifold is located at a side of the container.

16. The apparatus of claim 15, wherein the first manifold is configured to support portions of a plurality of wafers in the container.

17. The apparatus of claim 13, wherein the first manifold and second manifold are configured to extend vertically and horizontally across a width and height of an entire stack of wafers positioned therebetween.

18. The apparatus of claim 13, wherein the ports include check valves.

19. A method of reducing moisture and oxygen content of a semiconductor wafer container, the method comprising:

providing an enclosed container having a removable front door, a plurality of walls, sad first and second ports, said container being configured to support a plurality of wafers therein at a plurality of wafer positions;

providing a source of purge gas in fluid communication with the first port;

providing a manifold having a plurality of elongated openings, the openings extending a distance equal to or greater than the diameter of wafers suitable for support in the container, each adjacent pair of wafer positions having interposed therebetween one of the openings; and initiating a flow of purge gas into the container.

20. The method of claim 19, wherein the container is farther provided with a second manifold in fluid communication with the second port.

21. The method of claim 20, wherein the second port is in fluid communication with a vacuum pump.

22. The method of claim 21, further comprising controlling a flow rate of the purge gas into the container and a flow rate out of the container such that a pressure within the container is maintained within a specified range.

23. A method of controlling an atmosphere in a wafer carrying container, the method comprising:

providing a front opening unified pod, the pod comprising an inlet port and a plurality of wafers supported therein;

placing the pod onto a load port on a mobile vehicle, said vehicle comprising a source of purge gas and a vacuum pump joined to the load port;

supplying a purge gas to the inlet port in the pod;

distributing the purge gas through a first manifold which extends at least half the entire height of the front opening unified pod; and directing the purge gas through openings of the first manifold, a spacing between the openings corresponding to a spacing between pain of adjacent wafers, a bottom-most opening being positioned below a bottom-most wafer position of the front opening unified pod.

24. The method of claim 23, wherein the pod is farther provided with a second manifold in fluid communication with a second poll.

25. The method of claim 24, wherein the second port is in fluid communication with a vacuum pump.

26. The method of claim 25, further comprising controlling a flow rate of the purge gas into the pod and a flow rate out of the pod such that a pressure within the pod is maintained within a specified range.

27. The method of claim 23, wherein the manifold extends substantially the entire height of the pod.

28. A device comprising:

a manifold having a plurality of vertically-spaced openings said manifold being shaped to conform to a vertical wall of a wirer container;

wherein a spacing between said openings corresponds to a spacing between adjacent stacked semiconductor wafers; and wherein a bottom-most opening is positioned below a bottom-most wafer within the wafer container and a top-most opening is positioned above a top-most wafer within the wafer container;

wherein said manifold is made of a substantially non-reactive plastic material.

29. The device of claim 28, wherein the manifold is integrally formed with a vertical wall of a semiconductor FOUP.

* * * * *